(12) United States Patent
Peng et al.

(10) Patent No.: US 7,829,208 B2
(45) Date of Patent: Nov. 9, 2010

(54) CHROMIUM NITRIDE LAYER FOR MAGNETIC RECORDING MEDIUM

(75) Inventors: Yingguo Peng, Pittsburgh, PA (US); Bin Lu, San Ramon, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 194 days.

(21) Appl. No.: 11/947,288

(22) Filed: Nov. 29, 2007

(65) Prior Publication Data

US 2009/0142621 A1    Jun. 4, 2009

(51) Int. Cl.
*G11B 5/66* (2006.01)
(52) U.S. Cl. .................................... 428/831.2
(58) Field of Classification Search .............. None
See application file for complete search history.

(56) References Cited

U.S. PATENT DOCUMENTS

| | | | |
|---|---|---|---|
| 5,800,931 A | 9/1998 | Lee et al. ............... 428/611 |
| 6,036,824 A | 3/2000 | Hedgcoth ............. 204/192.16 |
| 6,348,276 B1 | 2/2002 | Chen et al. ............ 428/694 TS |
| 6,645,647 B1 | 11/2003 | Litvinov et al. ....... 428/694 TM |
| 7,186,471 B2 | 3/2007 | Lu et al. ................. 428/836.1 |
| 7,427,446 B2 * | 9/2008 | Murao et al. ............ 428/831.2 |
| 7,542,235 B2 * | 6/2009 | Kuboki ...................... 360/135 |
| 2004/0072027 A1 | 4/2004 | Lu et al. ................ 428/694 R |
| 2004/0191578 A1 | 9/2004 | Chen et al. ............ 428/694 TS |
| 2005/0089726 A1 | 4/2005 | Abarra .................. 428/694 TS |
| 2007/0009766 A1 | 1/2007 | Lu et al. ................. 428/836.1 |

OTHER PUBLICATIONS

Machine translation of JP 2001-189010, Maeda et al., Japan, Jul. 2001.*

* cited by examiner

*Primary Examiner*—Holly Rickman
(74) *Attorney, Agent, or Firm*—Z. Peter Sawicki; Westman, Champlin & Kelly, P.A.

(57) ABSTRACT

A magnetic recording media with a multilayer structure and methods for forming the media are described. The magnetic recording media includes a substrate, an underlayer on top of the substrate and a magnetic layer over the underlayer. The underlayer includes a CrN film formed by sputter depositing chromium in the presence of nitrogen or nitrogen containing compounds.

14 Claims, 4 Drawing Sheets

CHROMIUM NITRIDE LAYER FOR MAGNETIC RECORDING MEDIUM

BACKGROUND OF THE INVENTION

This invention relates to magnetic recording media and in particular to the layered structure of the magnetic recording media.

There are many different forms of mass data storage technology used in modern computing. One of the prevailing forms of data recording is magnetic data recording due to its large capacity and re-usable recording media. Magnetic data recording may be implemented utilizing different types of magnetic recording media, including tapes, hard disks, floppy disks, etc. There is an ever increasing need for magnetic recording media with higher storage capacity, lower noise, and lower costs.

The structure of a typical thin film magnetic recording disk is multilayered and includes a substrate at its base covered by one or more layers of thin film followed by a magnetic layer and optionally another layer on top of the magnetic layer. The magnetic layer may be coated with an overcoat and/or an organic lubricant. The magnetic layer is the main body on which the magnetic bits are recorded.

Magnetic recording media can be longitudinal magnetic recording media or, more recently, perpendicular magnetic recording media. Perpendicular recording media have many advantages over longitudinal recording media and are currently the more preferred magnetic recording media.

The composition of a magnetic layer can vary but can include such compounds as FePt or CoPt as described, for example, in US Patent Appln, Publication US2004/0191578 to Chen et al. The quality of the magnetic layer is in part determined by the layer or layers between the substrate and the magnetic layer. Important magnetic properties, for example, coercivity which are crucial to the recording performance of a disk can depend primarily on the microstructure of the various thin film layers.

A seedlayer disposed between a substrate and an underlayer is described in Lee et al. in U.S. Pat. No. 5,800,931. The seedlayer described in Lee et al. is a MgO sputter deposited thin film. An underlayer having chromium, a chromium alloy or a material having a B2 ordered crystalline structure is then placed on the seedlayer prior to forming the magnetic layer. Formation of a seedlayer using MgO can lead to slow process times in production. High quality crystals of MgO, which are crucial for an optimal magnetic recording medium, are difficult to obtain and can also lengthen the processing time in production.

SUMMARY OF THE INVENTION

A magnetic recording medium comprising a substrate, an underlayer comprising a CrN film and a magnetic layer.

A method for producing a magnetic recording medium comprises sputtering chromium in the presence of nitrogen or a nitrogen containing compound onto a substrate to form an underlayer comprising a CrN film and forming a magnetic layer over the underlayer.

Another aspect of the invention includes a heat assisted magnetic recording medium comprising a substrate, an underlayer that is a thermal resistor comprising a CrN film and a $L1_0$ magnetic layer.

DETAILED DESCRIPTION OF ILLUSTRATIVE EMBODIMENTS

The magnetic recording media described herein have a multilayer structure and generally include a substrate, an underlayer formed on the substrate and a magnetic layer. By underlayer is meant a layer between the magnetic layer and the substrate. The underlayer includes chromium sputtered onto a substrate. Preferably the chromium sputtering is conducted in the presence of nitrogen or nitrogen containing compounds such that a film of CrN is formed over the substrate. The CrN film may also be sputter deposited from a CrN target with or without the presence of nitrogen. A magnetic layer may be deposited directly on the CrN underlayer.

In alternative embodiments, a seedlayer may also be included in the magnetic recording medium. A seedlayer, as referred to herein, is a thin layer and can be formed between the substrate and the underlayer and/or between the underlayer and the magnetic layer.

Figure 1:
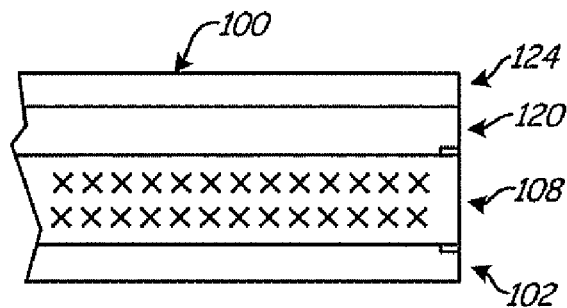
FIG. 1 is a schematic side view of a magnetic recording medium.

One embodiment, illustrated by FIG. 1, includes magnetic recording medium 100. The recording medium 100 includes substrate 102 upon which an underlayer 108 is formed. The underlayer 108 is formed by sputtering chromium in the presence of nitrogen or nitrogen containing compounds. A magnetic layer 120 is formed over underlayer 108. An overcoat layer 124 is deposited over magnetic layer 120.

Figure 2:
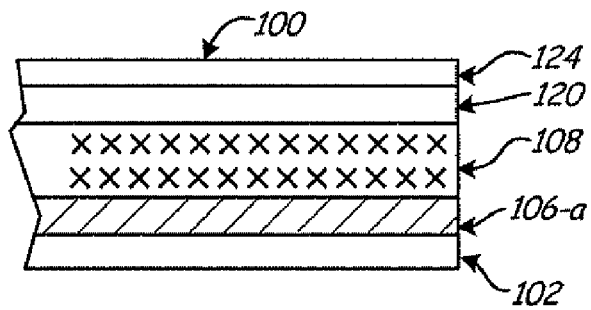
FIG. 2 is a schematic side view of a magnetic recording medium with a seedlayer below the underlayer.

FIG. 2 illustrates a schematic side view of an alternative embodiment of magnetic recording medium 100. Magnetic recording medium 100 includes seedlayer 106-a disposed between substrate 102 and underlayer 108. Magnetic layer 120 is formed over underlayer 108 and an overcoat layer 124 is deposited over magnetic layer 120.

Figure 3:
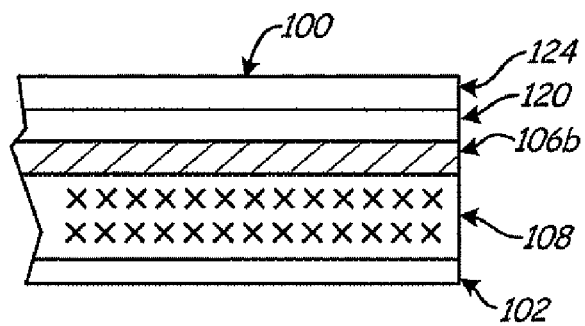
FIG. 3 is a schematic side view of a magnetic recording medium with a seedlayer above the underlayer.

FIG. 3 illustrates another alternative embodiment of magnetic recording medium 100 with substrate 102. Seedlayer 106-b is formed over underlayer 108. Magnetic layer 120 is placed over seedlayer 106-b followed by overcoat layer 124.

Figure 4:
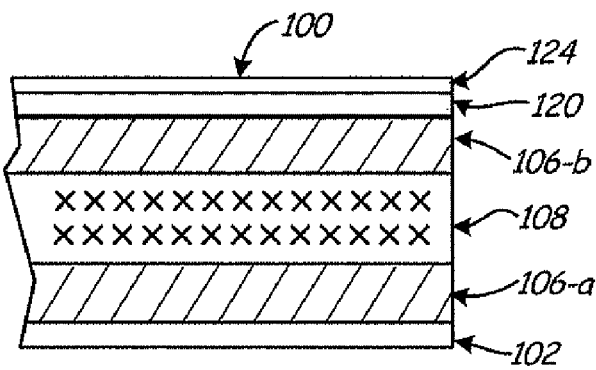
FIG. 4 is a schematic side view of a magnetic recording medium with an underlayer between two seedlayers.

FIG. 4 illustrates a schematic side view of another alternative embodiment of magnetic recording medium 100 with substrate 102. Seedlayer 106-a is formed over substrate 102. Underlayer 108 is deposited by sputtering chromium in the presence of nitrogen or nitrogen containing compounds over seedlayer 106-a. Seedlayer 106-b is formed over underlayer 108 followed by addition of magnetic layer 120 over seedlayer 106-b. Overcoat layer 124 is placed over magnetic layer 120. Seedlayer 106-a and seedlayer 106-b may be the same film, for example MgO. Alternatively, the seedlayers can be made from different components.

A variety of substrates can be used in the magnetic recording media describe herein. The substrate is generally formed of a nonmagnetic material. Suitable materials for the substrate can include, for example, high temperature glass, Si, ceramic glass, amorphous glass, NiP plated AlMg, sapphire, quartz, canasite, and SiC. Other suitable materials for substrates are known to those skilled in the art and are all within the scope of the description herein.

The underlayers of the magnetic recording media described herein are fabricated by reactively sputtering chromium in the presence of nitrogen or nitrogen containing compounds to form a CrN film. Sputtering is used in the formation of thin films in construction of magnetic recording media and is a well known technique in the art. Preferably, the chromium sputtering is performed in a $N_2$ atmosphere. The CrN film may also be fabricated by reactively sputtering chromium in a $NH_3$ atmosphere. The CrN film may be sputter deposited in other Nitrogen containing atmospheres. The CrN film may also be sputter deposited from a CrN target with or without the presence of nitrogen.

Figure 5A:
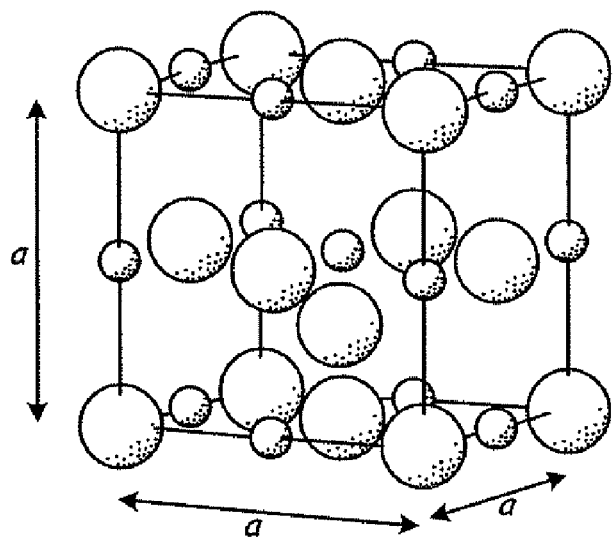
FIG. 5a is a diagram of a B1 phase crystallographic lattice structure.

The crystal structure and the texture of the underlayer are generally important parameters for the optimal functioning of the magnetic recording media. A variety of crystal structures and textures of the underlayer may be amenable in the magnetic recording media described herein. The crystal structure of the CrN film of the underlayer is, preferably, a B1 phase structure. FIG. 5a is a schematic diagram of a crystallographic cubic lattice structure in a B1 phase with a lattice parameter of "a". The sputtered CrN film described herein, preferably, has a B1 crystal structure. The lattice parameter of the CrN film is, preferably, close to the lattice parameter of the magnetic layer used in the recording media. When the lattice parameters of the underlayer and the magnetic layer are closely matched, a better texture transfer can occur between the underlayer and the magnetic layer. In one exemplary embodiment, the lattice parameter of the CrN film is about 0.414 nm. Values of the CrN film lattice parameter, preferably, do not vary by more than about 5% from this value. Values for the lattice parameter outside of this range are also within the scope of this invention.

The underlayer formed by chromium sputtering, preferably, attains a perpendicular (200) texture during the growth of the CrN thin film. This texture is preferable for a magnetic layer with an $L1_0$ phase crystal structure. The CrN film, preferably has a distribution angle of less than about 6°. More preferably, the CrN film has a distribution angle of about 4.5°. The thickness of the CrN film in the recording media described herein can be between about 1 nm and about 50 nm. Preferably, the thickness of the CrN film is between about 10 nm and about 20 nm.

The CrN film underlayer shows thermal resistance. Thermal resistance can be measured, for example, by DELCOM 717 conductance Monitor obtained from Delcom Instruments, Inc. Prescott, Wis. The CrN film underlayer can act as an insulator. In heat assisted magnetic recording (HAMR), thermal resistor layer is an important component of the medium structure. The CrN film can be used as the thermal resistor of HAMR media, Preferably, the CrN film acts as an insulator and the conductivity measured by the above mentioned instrument is zero.

Figure 5B:
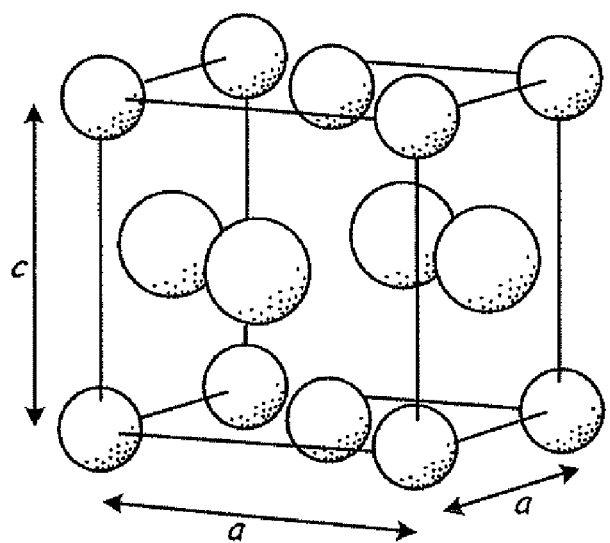
FIG. 5b is a diagram of a $L1_0$ phase crystallographic lattice structure.

The magnetic layer of the recording media can include a variety of components. The magnetic recording media may be longitudinal or perpendicular. In preferred embodiments, the magnetic recording media is perpendicular. The magnetic layer described herein, preferably contains a $L1_0$ phase crystal structure. FIG. 5b is a schematic diagram of a crystallographic lattice structure in $L1_0$ phase with lattice parameters of "a" and "c". Magnetic layers with a $L1^0$ phase crystal structure thus contain lattice parameters "a" and "c". Suitable magnetic layers can include, for example, FePt, CoPt and FePd. A FePt magnetic layer, for example, has a lattice parameter "a" of about 0.385 nm and parameter "c" of about 0.371 nm. Similarly, CoPt has a lattice parameter "a" of about 0.380 nm and parameter "c" of about 0.370 nm and FePd has a lattice parameter "a" of about 0.385 nm and "c" of about 0.372 nm. Values of the lattice parameter for the $L1_0$ phase magnetic layer, preferably, do not vary by more than about 5% from these values. Vales for the lattice parameter outside of these range are also within the scope of this invention.

An overcoat layer may be provided over the magnetic layer as shown in FIG. 1-4. The overcoat layer provides a mechanical wear layer and can be between about 2.5 nm and about 30 nm. The overcoat layer is generally an inert layer and does not affect the function of the magnetic recording media. The overcoat layer is preferably carbon based.

The recording media described herein may optionally include a seedlayer. The presence of the seedlayer is not necessary but in some embodiments may enhance the functioning of the recording media. As shown in FIG. 2, a seedlayer may be formed between the substrate and the underlayer. The seedlayer can be any thin film that is compatible S with the CrN texture and crystal structure. Preferably, the seedlayer is a MgO layer that is sputter deposited onto the substrate. The seedlayer preferably has a (200) texture similar to the CrN film. The seedlayer generally has a thickness of less than about 5 nm.

In other embodiments, as shown, for example, in FIG. 3, a seedlayer may be formed between the underlayer and the magnetic layer. In alternative embodiments, as shown, for example, in FIG. 4, the magnetic recording medium can include two seedlayers. As described above, one seedlayer can be disposed between the substrate and the underlayer and the second seedlayer is placed between the underlayer and the magnetic layer. Both the seedlayers can be the same. Alternatively, the seedlayers can be different. In preferred embodiments, the seedlayers are MgO thin film layers.

A method for producing magnetic recording media is also contemplated in this description. The method for producing magnetic recording media includes sputter depositing chromium in the presence of nitrogen or nitrogen containing compounds onto a substrate to form a CrN film underlayer. The method further includes forming a magnetic layer, preferably a $L1_0$ phase magnetic layer, over the CrN underlayer. An overcoat layer may be formed over the magnetic layer.

In some embodiments, the method may include forming a seedlayer between the substrate and the CrN film. The seedlayer is preferably formed by sputter depositing MgO onto the substrate prior to forming the underlayer. In other embodiments, the method may include forming a seedlayer between the CrN film and the magnetic layer. The seedlayer is preferably formed by sputter depositing a MgO layer on top of the CrN film prior to forming the magnetic layer.

In other alternative embodiments, the method may include forming two seedlayers. The seedlayer can be formed between the substrate and the underlayer and between the underlayer and the magnetic layer. Both of the seedlayers may be sputter deposited MgO films. Alternatively, one of the seedlayers can be another compatible thin film.

EXAMPLE

A high temperature glass and Si substrate was used to produce a magnetic recording medium. A CrN film was fabricated onto the substrate by reactively sputtering Cr in a $N_2$ atmosphere. The sputtering was conducted in a Cirulus M-12 sputtering chamber manufactured by Oerlikon, Liechtenstein. A sputtering production assembly line includes a series of chambers through which the substrate passes unidirectionally with controlled parameters. Sputtering was performed at room temperature at a pressure of about 5 mTorr with pure nitrogen gas. A FePt $L1_0$ phase magnetic layer was grown over the CrN film. An overcoat was placed over the magnetic layer.

Figure 6:
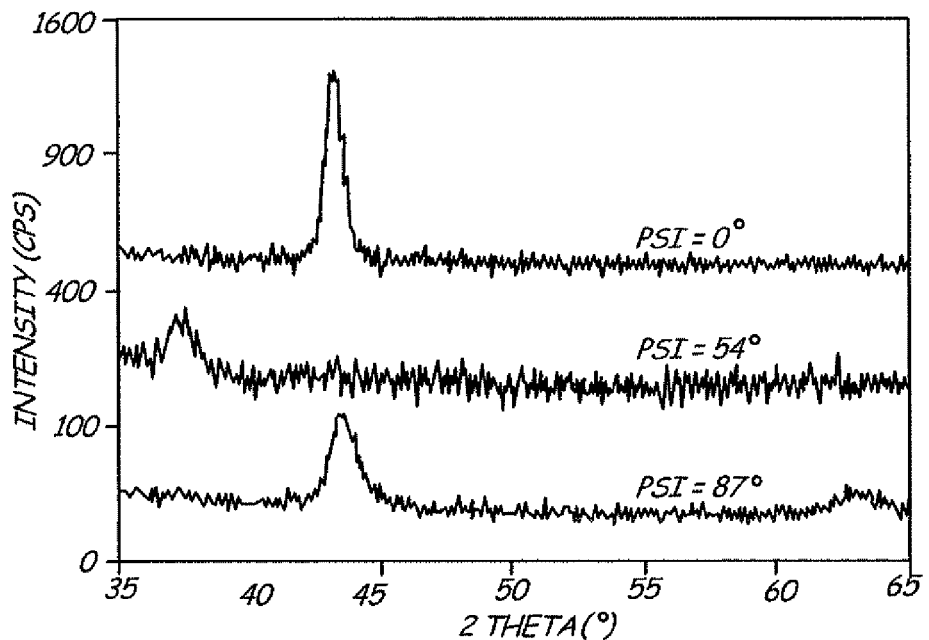
FIG. 6 is a XRD scan of a CrN film at different Psi tilt angles.
Figure 7:
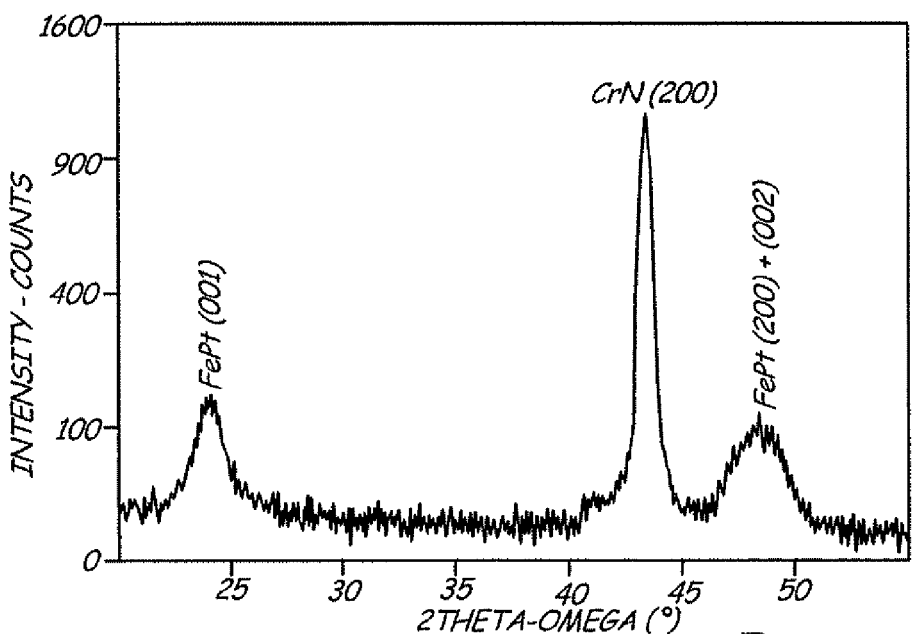
FIG. 7 is a XRD scan of FePt film grown on a CrN film.
Figure 8:
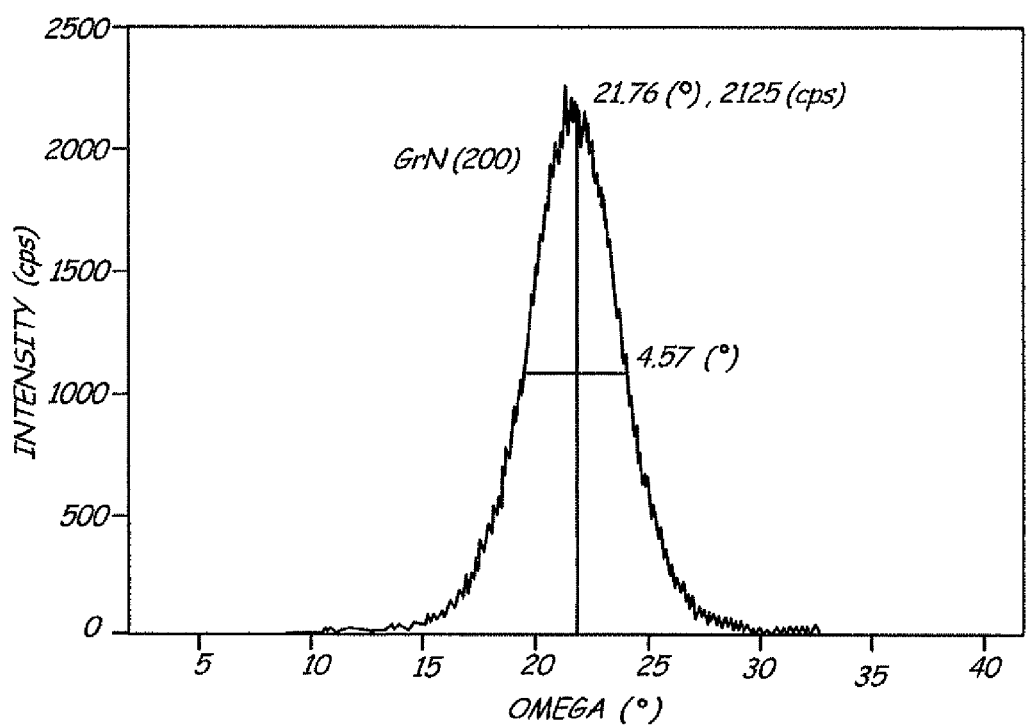
FIG. 8 is a XRD rocking curve of CrN(200) peak.

FIG. 6 shows an X-ray Diffraction (XRD) scan at different Psi tilt angles. The scan shows that reactive sputtering of Cr in $N_2$ forms a CrN film (not Cr or $Cr_2N$). The CrN film has a B1 phase crystal structure. As shown in the XRD scan of FIG. 7, the FePt film grown on top of the CrN film has inherited the perpendicular texture. The XRD rocking curve of FIG. 8 shows that the CrN film has a texture distribution angle of about 4.5°.

It is to be understood that even though numerous characteristics and advantages of various aspects have been set forth in the foregoing description, together with details of the structure and function of various aspects, this is illustrative only, and changes may be made in detail, especially in matters of structure and arrangement of parts to the full extent indicated by the broad general meaning of the terms in which the appended claims are expressed.

What is claimed is:

1. A magnetic recording medium comprising:
   a substrate;
   an underlayer comprising a CrN film having a B1 phase crystal structure;
   a first seedlayer comprising MgO disposed between the substrate and the CrN underlayer; and
   a magnetic layer.

2. The recording medium of claim 1 wherein the CrN film is formed by sputter depositing chromium in the presence of nitrogen or nitrogen containing compounds.

3. The recording medium of claim 1 wherein the CrN film has a (200) texture.

4. The recording medium of claim 1 wherein the thickness of the underlayer is less than about 50 nm.

5. The recording medium of claim 1 wherein the CrN layer has a texture distribution angle of less than about 5°.

6. The recording medium of claim 1 wherein the magnetic layer is a $L1_0$ phase magnetic layer.

7. The recording medium of claim 1 wherein the magnetic layer has a (001) texture.

8. The recording medium of claim 1 wherein the magnetic layer comprises FePt.

9. The recording medium of claim 1 wherein the magnetic layer comprises CoPt.

10. The recording medium of claim 1 wherein the substrate is glass, silicon, or an aluminum alloy coated with NiP.

11. The recording medium of claim 1 further comprising a second seedlayer between the CrN underlayer and the magnetic layer.

12. The recording medium of claim 1 wherein the thickness of the seedlayer is less than about 5 nm.

13. A heat assisted magnetic recording medium comprising:
    a substrate;
    a thermal resistor underlayer comprising a CrN film having a B1 phase crystal structure;
    a first seedlayer comprising MgO disposed between the substrate and the underlayer; and
    a $L1_0$ magnetic layer.

14. The heat assisted magnetic recording medium of claim 13 wherein the CrN film is formed by sputter depositing chromium onto the substrate in the presence of nitrogen and nitrogen containing compounds.

* * * * *